United States Patent [19]

Shumate et al.

[11] Patent Number: 4,879,720
[45] Date of Patent: Nov. 7, 1989

[54] DECODER RING SYSTEM

[75] Inventors: William A. Shumate; Daniel R. Kindred, both of San Diego; Franklin P. Antonio, Del Mar; Steven H. Gardner, San Diego; Krishnanand Kelkar, La Jolla, Calif.; Thomas R. Bilotta, Vista; Steven L. Rogers, San Diego, all of Calif.

[73] Assignee: M/A-Com Government Systems, Inc., San Diego, Calif.

[21] Appl. No.: 166,187

[22] Filed: Mar. 10, 1988

[51] Int. Cl.$^4$ ............................................. G06F 11/10
[52] U.S. Cl. ..................................................... 371/43
[58] Field of Search ...................... 371/37, 43, 44, 45, 371/46, 35

[56] References Cited

U.S. PATENT DOCUMENTS 3,657,700  4/1972  Lutzker ............................. 371/41 X
3,665,396  5/1972  Forney .............................. 371/46 X
4,677,625  6/1987  Betts ...................................... 371/43

OTHER PUBLICATIONS

Viterbi, "Error Bounds for Convolutional Codes and an Asympotically Optimum Recording Algorithm", IEEE Transactions on Information Theory, vol. IT-13, No. 2, Apr. 1967, pp. 260-269.

Odenwalder, "Error Control", Data Communications, Networks and Systems, Bartee, Ed. Sams 1985, Ch. 10, pp. 289-354.

Yasuda et al., "Development of Variable-Rate Viterbi Decoder and Its Performance Characteristics", Sixth International Conference on Digital Satellite Communications, Sep. 19-23, 1983, pp. XII-24 to XII-31.

*Primary Examiner*—Jerry Smith
*Assistant Examiner*—Robert W. Beausoliel
*Attorney, Agent, or Firm*—Edward W. Callan

[57] ABSTRACT

A decoding system capable of outputting Viterbi-decoding-algorithm-decoded data at a predetermined rate that is greater than a given rate at which coded data is processed in accordance with said algorithm to produce the decoded data. The system includes a data input bus; a data output bus; a ring of decoders, with each decoder being coupled to the input bus for receiving coded data from the input bus and coupled to the output bus for providing decoded data onto the output bus. Each of the decoders in the ring includes an input buffer, timing controller, decoding processor and output buffer. The input buffer responds to a start-input signal from a preceding decoder in the ring by buffering a block of the received coded data. The timing contoller provides a start-input signal to a succeeding decoder in the ring at such time as to cause the succeeding decoder to receive a block of coded data from the input bus that overlaps the block of coded data received from the input bus by the instant said decoder. The decoding processor processes the buffered block of coded data at a given rate to produce decoded data. The output buffer buffers the block of decoded data. The timing controller also responds to a start-up signal provided by a preceding decoder in the ring by causing the buffered decoded data to be provided onto the data output bus at a predetermined rate that is greater than the given rate at which the coded data is processed to produce the decoded data; and further provides a start-output signal to the succeeding decoder in the ring to cause the succeeding decoder to provide a portion of the buffered decoded data therein onto the data output bus at a predetermined rate and at such time as to be continuous from and not overlap the portion of the buffered decoded provided onto the output data bus from the instant said decoder.

22 Claims, 3 Drawing Sheets

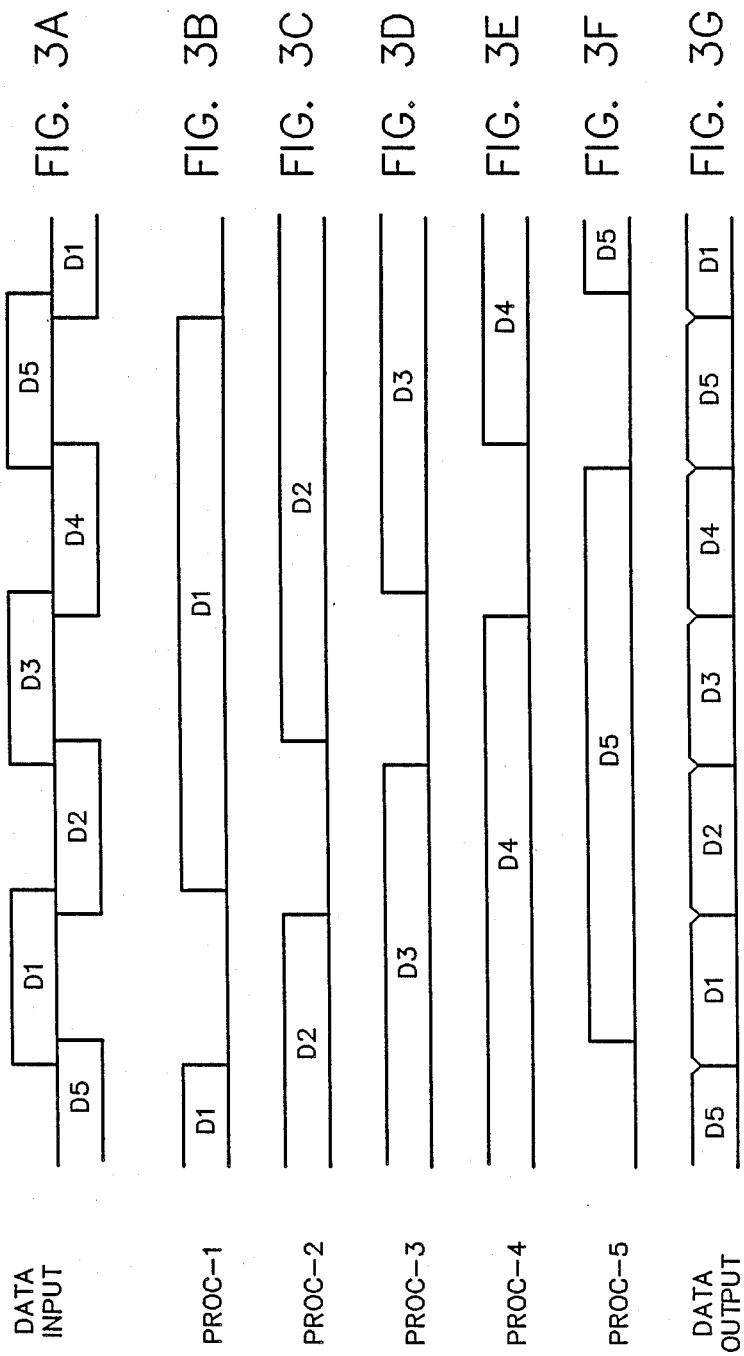

DECODER RING SYSTEM

BACKGROUND OF THE INVENTION

The present invention generally pertains to electronic systems for decoding coded binary data and is particularly directed to a decoding system that decodes data in accordance with the Viterbi decoding algorithm.

The Viterbi decoding algorithm is described in a paper entitled "Error Bounds for Convolutional Codes and an Asymptotically Optimum Decoding Algorithm" by Andrew J. Viterbi, published in "IEEE Transactions on Information Theory", Vol. IT-13, No. 2, April 1967, at pages 260–269. Decoders that use the Viterbi decoding algorithm for decoding coded data are known as Viterbi decoders.

The use of Viterbi decoders for decoding data that has been convolutionally coded in accordance with different fractional-rate codes and modulated for transmission by different modulation techniques is described in papers entitled "Error Control" by Joseph P. Odenwalder, published in "Data Communications, Networks, and Systems", Thomas C. Bartee, Ed. (Indianapolis: Howard W. Sams, 1985) at Chapter 10, pages 289–354; and "Development of Variable-Rate Viterbi Decoder and its Performance Characteristics" by Yutaka Yasuda, Yasuo Hirata, Katsuhiro Nakamura and Susumu Otani published in "Sixth International Conference on Digital Satellite Communications, Sept. 19–23, 1983", at pages XII-24 to XII-31.

The Viterbi decoding algorithm includes a great many processing steps, whereby the decoded-data production rate of a Viterbi decoder is limited to a given rate that may be less than the rate at which the decoded data may be processed by some data processing systems that may be coupled to the decoder.

SUMMARY OF THE INVENTION

The present invention is a decoding system capable of outputting decoded data at a predetermined rate that is greater than a given rate at which coded data is processed by a single decoder to produce the decoded data. In particular, the present invention provides a decoding system capable of outputting Viterbi-decoding-algorithm-decoded data at a predetermined rate that may be greater than a given rate at which coded data is processed in accordance with said algorithm by a single Viterbi decoder to produce the decoded data. The system of the present invention includes a data input bus; a data output bus; a ring of decoders, with each decoder being coupled to the input bus for receiving coded data from the input bus and coupled to the output bus for providing decoded data onto the output bus. Each of the decoders in the ring includes an input buffer for responding to a start-input signal from a preceding decoder in the ring by buffering a block of the received coded data; means for providing a startinput signal to a succeeding decoder in the ring at such time as to cause the succeeding decoder to receive a block of coded data from the input bus that overlaps the block of coded data received from the input bus by the instant said decoder; processing means for processing the buffered block of coded data at a given rate to produce decoded data; an output buffer for buffering the block of decoded data; means for responding to a start-output signal provided by a preceding decoder in the ring by causing the buffered decoded data to be provided onto the data output bus at a predetermined rate that is greater than the given rate at which the coded data is processed to produce the decoded data; and means for providing a start-output signal to the succeeding decoder in the ring to cause the succeeding decoder to provide a portion of the buffered decoded data therein onto the data output bus at a predetermined rate and at such time as to be continuous from and not overlap the portion of the buffered decoded provided onto the output data bus from the instant said decoder.

The present invention thus enables existing designs of Viterbi decoders, which produce decoded data at a given rate, to be used in a system having a decoded-data-output-rate requirement that exceeds such given decoded-data-production rate. Accordingly, the expense of designing a faster decoder is spared and the decoding system may be produced more economically. Also, when decoded-data-production rate is limited by technological considerations, the decoder ring system permits the decoded data to be output at a rate in excess of the technology-limited decoded data production rate.

Additional features of the present invention are described in relation to the description of the preferred embodiment.

BRIEF DESCRIPTION OF THE DRAWING

FIGS. 3A through 3G are timing diagrams illustrating the overlapped inputting of coded data into a plurality of the decoders in the decoder ring system of FIG. 1, the processing durations for the decoders, and the continuous outputting of decoded data from the decoders.

DESCRIPTION OF THE PREFERRED EMBODIMENT

Figure 1:
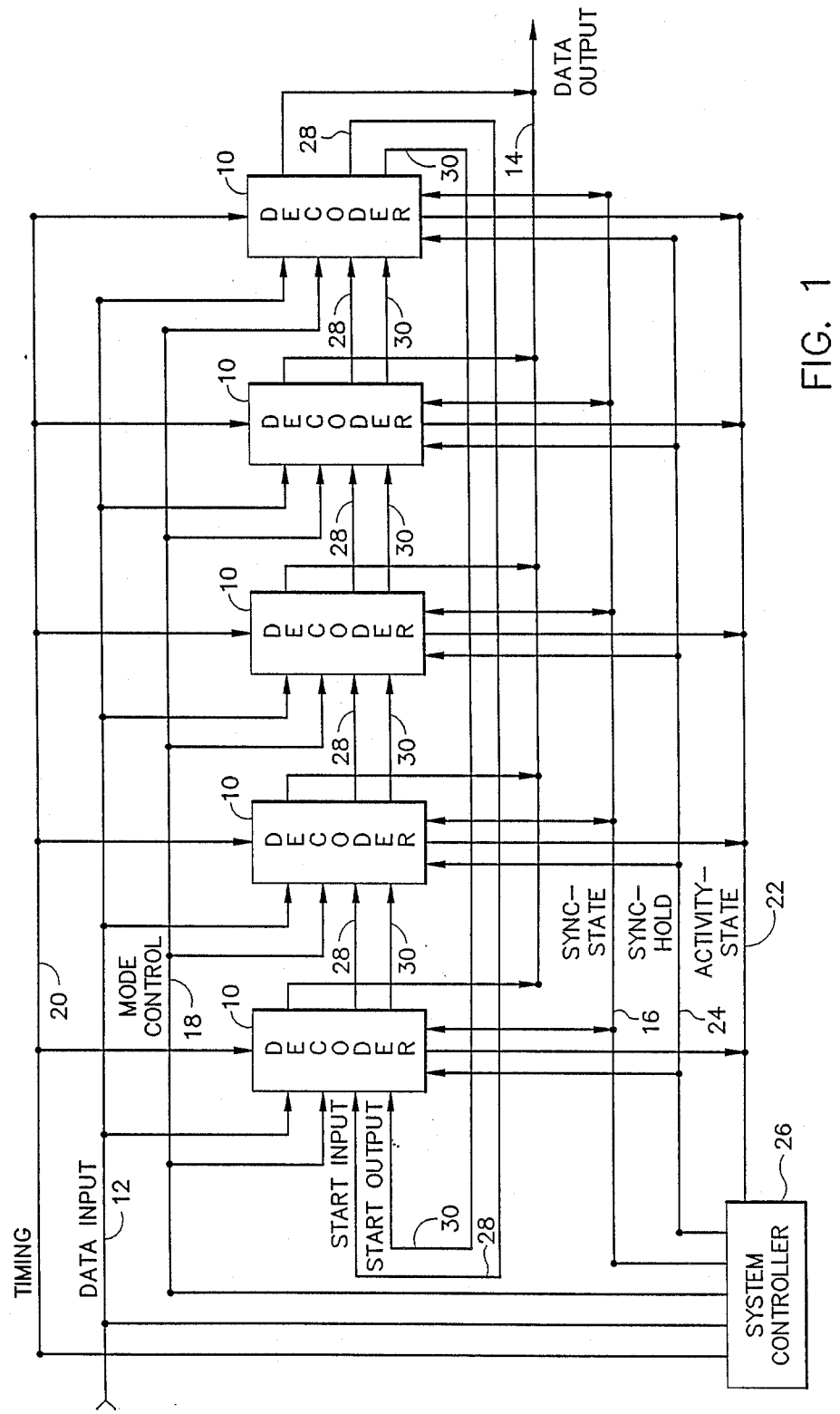
FIG. 1 is a block diagram of a decoder ring system according to a preferred embodiment of the present invention.

Referring to FIG. 1, a preferred embodiment of a decoding system according to the present invention includes a ring of decoders 10, a data input bus 12, a data output bus 14, a synchronization-state bus 16, a mode control bus 18, a timing bus 20, an activity-state bus 22, a sync-hold bus 24 and a system controller 26. Each decoder 10 is coupled to each of the aforementioned buses. The decoders 10 are coupled together in a ring by lines 28, which carry a start-input signal from each decoder 10 to the succeeding decoder 10 in the ring, and lines 30, which carry a start-output signal from each decoder 10 to the succeeding decoder 10 in the ring. Each decoder 10 is coupled to the data input bus 12 for receiving coded data from the data input bus 12 and is coupled to the data output bus 14 for providing decoded data onto the data output bus 14. The number of decoders 10 in the ring is dependent upon the relative rates at which each decoder 10 processes the coded data to produce decoded data, at which the coded data is received by each decoder 10 from the data input bus 12, and at which each decoder 10 provides decoded data onto the data output bus 14.

Figure 2:
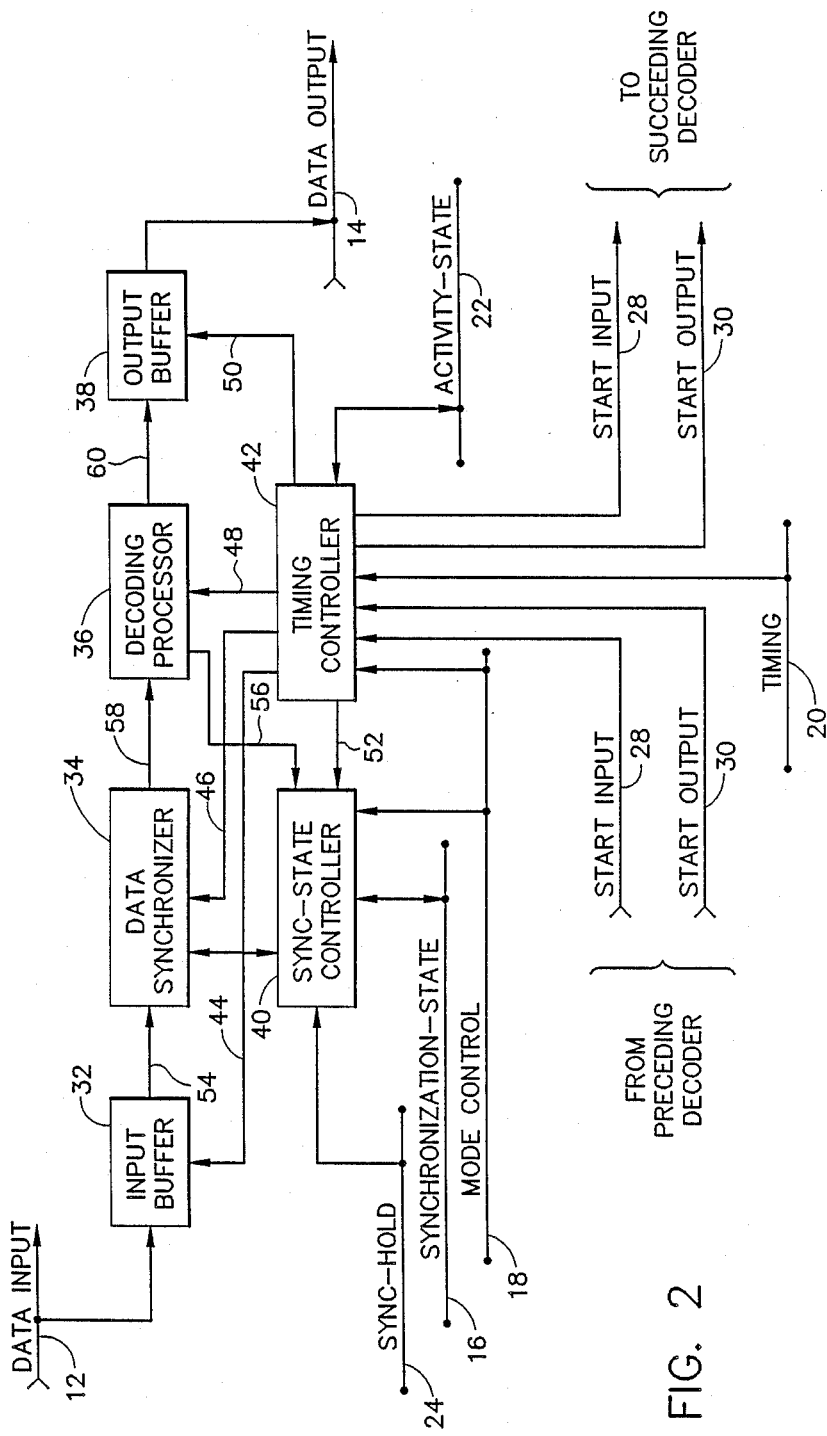
FIG. 2 is block diagram of a decoder included in the decoder ring system of FIG. 1.

Referring to FIG. 2, each of the decoders in the ring includes an input buffer 32, a data synchronizer 34, a decoding processor 36, an output buffer 38, a sync-state controller 40 and a timing controller 42.

The timing controller 42 provides control, timing and clock signals to the input buffer 32 via lines 44, the data synchronizer 34 via lines 46, the decoding processor 36 via lines 48, the output buffer 38 via lines 50, and the sync-state controller 40 via lines 52 in response to mode control signals received from the mode control bus 18, a system clock signal received from the timing bus 20, the start-input signal received on line 28 from the preceding decoder in the ring and the start-output signal received on line 30 from the preceding decoder in the ring. The system clock signal on the timing bus 20 is synchronized by the system controller 26 with the symbol rate clock for the data input bus 12.

The timing controller 42 responds to a start-input signal on line 28 from a preceding decoder in the ring by causing the input buffer 32 to buffer a block of coded data received from the data input bus 12.

The data synchronizer 34 synchronizes the coded data on line 54 from the input buffer 32 for processing by the decoding processor 36. The data synchronizer 34 synchronizes the coded input data symbols by arranging the order and the value of the symbol bits in accordance with a predetermined synchronization state included in a prescribed set of predetermined synchronization states. The particular set of predetermined synchronization states that is prescribed is determined in accordance with the particular modulation scheme used to modulate the coded data (e.g. BPSK, QPSK, OQPSK) and the particular rate at which the data was coded (e.g. 7/8, 3/4, 1/2). The synchronization state in which the data synchronizer 34 arranges the coded data for processing is controlled by the sync-state controller 40 in accordance with mode control signals received from the mode control bus 18, timing and clock signals received from the timing controller 42, a synchronization-state signal received from the synchronization-state bus 16, and processing data received on line 56 from the decoding processor 36. Prior to synchronizing each new block of buffered coded data from the input buffer 32, the data synchronizer 34 is initialized by the sync-state controller 40 in the synchronization state indicated by the synchronization-state signal last received from the synchronization-state bus 16. The mode control signals received from the mode control bus 18 indicate the modulation scheme used to modulate the coded data and the particular rate at which the data was coded.

The processing data received on line 56 from the decoding processor 36 is processed by the sync-state controller 40 to determine whether the buffered coded data is in a synchronization state that enables the coded data to be correctly decoded by the decoding processor 36. When the sync-state controller 40 determines that the buffered coded data is not in a synchronization state that enables the coded data to be correctly decoded by the decoding processor 36, the sync-state controller 40 causes data synchronizer 34 to resynchronize the buffered coded data in a different synchronization state included in the prescribed set of synchronization states, for processing by the decoding processor 36. Until the sync-state controller 40 determines that the buffered coded data is in a synchronization state that enables the coded data to be correctly decoded by the decoding processor 36, the sync-state controller 40 causes the data synchronizer 34 to continue to resynchronize the buffered coded data by utilizing the different predetermined synchronization states in the prescribed set in accordance with a predetermined sequence of the predetermined synchronization states. Coded synchronization for a variable-rate Viterbi decoder is well known to those skilled in the art. Examples of such coded data synchronization are described in the aforementioned publication authored by Yasuda et al.

The synchronized coded data on line 58 from the data synchronizer 34 is processed by the decoding processor 36 in a accordance with the Viterbi decoding algorithm at a given rate to produce decoded data on line 60.

The output buffer 38 buffers the decoded data received on line 60 from the decoding processor 36 and provides the coded data onto the data output bus 14 at a predetermined rate that may be greater than the given rate at which the coded data is processed by the decoding processor 36 to produce the coded data on line 60.

The timing controller 42 of a given decoder provides a start-input signal on line 28 to the succeeding decoder in the ring to cause the succeeding decoder to receive a block of coded data from the data input bus 12 that overlaps the block of coded data received from the data input bus 12 by the given decoder. Such overlapping is illustrated in FIG. 3A. While FIGS. 3B–3F illustrate timing diagrams for a ring of five decoders, it should be understood that the selection of "five" decoders is merely for the purpose of illustration. The number of decoders 10 in the ring is dependent upon the relative rates at which each decoder 10 processes the coded data to produce decoded data, at which the coded data is received by each decoder 10 from the data input bus 12, and at which each decoder 10 provides decoded data onto the data output bus 14. In FIGS. 3A–3G, the respective durations for loading coded data into the respective decoders 10 (FIG. 3A), for processing the coded data in the respective decoders 10 to produce decoded data (FIGS. 3B–3F), and for outputting the decoded data from the respective decoders 10 (FIG. 3G) are labeled D-1, D-2, D-3, D-4, and D-5; and the processing-duration time lines for the respective decoders 10 are labeled PROC-1, PROC-2, PROC-3, PROC-4 and PROC-5. Note that the processing time for each decoder exceeds the time required to buffer a block of coded data from the data input bus 12 into a single decoder, and extends from the end of one input buffer period for a given decoder to the beginning of the next input buffer period for the given decoder. There is sufficient overlap in loading coded data from the data input bus 12 into adjacent decoders 10 in the ring to enable the decoding processor 36 of the succeeding decoder 10 to be initialized and to push the last data of the previously decoded block of coded data out of the input buffer 32 of the succeeding decoder 10.

The timing controller 42 responds to a start-output signal on line 30 from a preceding decoder in the ring by causing the buffered decoded data to be provided from the output buffer 38 onto the data output bus 14 at a predetermined rate that may be greater than the given rate at which the coded data is processed by the decoding processor 36 to produce the decoded data on line 60.

The timing controller 42 of a given decoder 10 provides a start-output signal on line 30 to the succeeding decoder in the ring to cause the succeeding decoder 10 to provide a portion of the buffered decoded data therein onto the data output bus 14 at a predetermined rate and at such time as to be continuous from and not overlap the portion of the buffered decoded provided onto the data output bus 14 from the given decoder. The continuous outputting of decoded data from the decoders 10 in the ring is illustrated in FIG. 3G. The portion of the buffered decoded data that is provided from the output buffer 38 onto the data output bus 14 is that portion of the decoded data that was produced by processing coded data that did not overlap the coded data loaded into the preceding decoder in the ring of decoders.

When the decoding processor 36 finishes producing of the block of decoded data that is being provided onto the output data bus 14, the sync-state controller 40 provides onto the synchronization-state bus 16 during the provision of the decoded data onto the data output bus 14, synchronization-state information indicating the synchronization state of the buffered coded data provided on line 58 for processing by the decoding processor 36. The sync-state controller 40 causes the data synchronizer 34 to initialize the synchronization state of the buffered coded data on line 58 for processing by the decoding processor 36 in accordance with the last synchronization-state information provided onto the synchronization-state bus 16 prior to beginning to process a newly inputted block of coded data. The sync-state conntroller 40 also responds to a predetermined master-decoder-sync-mode control signal from the mode control bus 18 by causing the data synchronizer 34 to initialize the synchronization state of the buffered coded data on line 58 for processing by the decoding processor 36 prior to beginning to process a newly inputted block of buffered coded data, in accordance with the synchronization-state information provided on the synchronization-state bus 16 by a predetermined coder in the decoder ring designated as a master decoder instead of in accordance with the last synchronization-state information provided on the synchronization-state bus 16 by some other some decoder in the ring.

The system controller 26 detects perturbations in the coded data received on the data input bus 12 and provides a sync-hold signal on the sync-hold bus 24 for a predetermined duration in response to detecting a such perturbation. The sync-state controller in each decoder 10 in the decoder ring responds to the sync-hold signal from the sync-hold bus 24 by inhibiting the data synchronizer 34 from resynchronizing the coded data during the duration of the sync-hold signal. The sync-state controller 40 further inhibits the data synchronizer 34 from resynchronizing the buffered coded data following the duration of the sync-hold signal until such time as a new block of coded data is buffered into the input buffer 32 thus flushing out any bad data that may have been loaded into the decoder during the perturbation.

When the given rate at which the decoding processor 36 processes the coded data to produce the decoded data is greater than the rate at which coded input data is received from the data input bus 12 and greater than the rate at which decoded data is to be provided onto the data output bus 14, the system controller 26 sends a mode control signal over the mode control bus 18 to the timing controllers 42 of the respective decoders 10 in the ring which causes the received coded data to be loaded into only one of the decoders 10. The timing controller 42 of the decoder into which the received coded data is loaded then provides a control signal on line 44 to the input buffer 32 that causes the coded data received from the data input bus 12 to bypass the input buffer 32 and be fed into the data synchronizer 34 at the rate it is received from the data input bus 12, and further provides a control signal on line 50 to the output buffer 38 that causes the decoded data on line 60 from the decoding processor 36 to bypass the output buffer 38 and be provided onto the data output bus at the rate is produced on line 60 by the decoding processor 36.

The timing controller 42 provides an activity indication signal on the activity-state bus 22 while decoded data is being provided onto the data output bus 14 from the output buffer 38. The timing controller 42 of at least one of decoders in the ring of decoders also monitors the activity-state bus 22, and causes the instant decoder to cease operations if there is already an activity indication signal on the activity-state bus 14 when the instant decoder begins to provide decoded data onto the data output bus 14 from the output buffer 38.

The timing controller 42 of at least one of the decoders in the ring of decoders also causes the instant decoder to ceasing operation if either a startinput or a start-output signal is received by timing controller 42 of the instant decoder while the decoding processor 36 thereof is processing a block of coded data.

The system controller 26 monitors the status of the activity-state bus 14 and provides a reset signal on the mode control bus 18 to the timing controller 42 of at least one of the decoders in the ring of decoders when said monitoring does not detect that decoded data is being provided onto the output bus 14 from the decoders in the ring. The timing controller 42 of at least one of the decoders in the ring of decoders responds to a reset signal received over the mode control bus 18, in lieu of the start-input signal on line 28 and in lieu of the start-output signal on line 30, by initiating the input of a block of coded data into the input buffer 32 from the data input bus 12 and by initiating the provision of buffered decoded data onto the data output bus 14 from the output buffer 38.

In an alternative preferred embodiment, the timing controller 42 of one of the decoders, which is designated as a master decoder, also performs the functions of the system controller 26.

We claim:

1. A decoding system capable of outputting Viterbi-decoding-algorithmdecoded data at a predetermined rate that is greater than a given rate at which coded data is processed in accordance with said algorithm by a single decoder to produce the decoded data, comprising a data input bus;
a data output bus;
a ring of decoders, with each decoder coupled to the input bus for receiving coded data from the input bus and coupled to the output bus for providing decoded data onto the output bus;
wherein each said decoder includes
an input buffer for responding to a start-input signal from a preceding decoder in the ring by buffering a block of the received coded data;
means for providing a start-input signal to a succeeding decoder in the ring at such time as to cause the succeeding decoder to receive a block of coded data from the input bus that overlaps the block of coded data received from the input bus by the instant said decoder;
processing means for processing the buffered block of coded data in accordance with a Viterbi decoding algorithm at a given rate to produce decoded data;
an output buffer for buffering the block of decoded data;
means for responding to a start-output signal provided by a preceding decoder in the ring by causing the buffered decoded data to be provided onto the data output bus at a predetermined rate that is greater than the given rate at which the coded data is processed to produce the decoded data; and means for providing a start-output signal to the succeeding decoder in the ring to cause the succeeding decoder to provide a portion of the buffered decoded data therein onto the data output bus at a predetermined rate and at such time as to be continuous from and not overlap the portion of the buffered decoded data provided onto the output data bus from the instant said decoder.

2. A system according to claim 1, further comprising a synchronization-state bus;

wherein each said decoder further comprises means for synchronizing the buffered coded data for processing by the processing means; and means for providing onto the synchronization-state bus during the provision of the decoded data onto the output data bus, synchronization-state information indicating the synchronization state of the buffered coded data for processing upon finishing the decoding of the block of coded data that is being provided onto the output data bus;

wherein the synchronizing means initialize the synchronization state of the buffered coded data for processing by the processing means in accordance with the last synchronization-state information provided onto the synchronizationstate bus prior to beginning to process a block of coded data.

3. A system according to claim 2, wherein each said decoder further comprises means responsive to a predetermined mode signal for causing the synchronizing means to initialize the synchronization state of the buffered coded data for processing by the processing means prior to beginning to process a block of buffered coded data, in accordance with the synchronization-state information provided on the synchronization-state bus by a predetermined master said decoder instead of in accordance with the last synchronization-state information provided on the synchronization-state bus by some other decoder.

4. A system according to claim 2, wherein each said decoder further includes means for determining whether the buffered coded data is in a synchronization state that enables the coded data to be correctly decoded by the processing means;

wherein the synchronizing means includes means for resynchronizing the buffered coded data for processing by the processing means when it is determined that the buffered coded data is not in a synchronization state that enables the buffered coded data to be correctly decoded by the processing means; and wherein the system further comprises means for detecting a perturbation in the coded data received on the data input bus;

means for providing a sync-hold signal for a predetermined duration in response to detecting a said perturbation; and means for reponding to said sync-hold signal by inhibiting the synchronizing means from resynchronizing said coded data during the duration of said sync-hold signal.

5. A system according to claim 4, further comprising means for inhibiting the synchronizing means from resynchronizing said coded data following the duration of the sync-hold signal until such time as a new block of coded data is buffered into the first buffering means of the first said decoder.

6. A system according to claim 1, further comprising an activity-state bus;

wherein each said decoder includes means for providing an activity indication signal on the activity-state bus while decoded data is being provided onto the data output bus from the instant said decoder; and wherein at least one said decoder includes means for monitoring the activity-state bus; and means for ceasing operation of the instant said decoder if there is already an activity indication signal on the activity-state bus when the instant said decoder begins to provide decoded data onto the data output bus.

7. A system according to claim 6, further comprising a system controller for monitoring the status of the activity-state bus and for providing a reset signal to the decoders when said monitoring does not detect that decoded data is being provided onto the output bus from the decoders in the ring;

wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

8. A system according to claim 1, wherein each said decoder further includes means for ceasing operation of the instant said decoder if a start-input signal is received by the instant said decoder while the processing means thereof is processing said block of coded data.

9. A system according to claim 8, further comprising an activity-state bus;

wherein each said decoder includes means for providing an activity indication signal on the activity-state bus while decoded data is being provided onto the data output bus from the instant said decoder; and wherein the system further comprises a system controller for monitoring the status of the activity-state bus and for providing a reset signal to the decoders when said monitoring does not detect that decoded data is being provided onto the output bus from the decoders in the ring;

wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

10. A system according to claim 1, wherein each said decoder further includes means for ceasing operation of the instant said decoder if a start-output signal is received by the instant said decoder while the processing means thereof is processing said block of coded data.

11. A system according to claim 10, further comprising an activity-state bus;

wherein each said decoder includes means for providing an activity indication signal on the activity-state bus while decoded data is being provided onto the data output bus from the instant said decoder; and wherein the system further comprises a system controller for monitoring the status of the activity-state bus and for providing a reset signal to the decoders when said monitoring does not detect that decoded data is being provided onto the output bus from the decoders in the ring;

wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

12. A decoding system capable of outputting decoded data at a predetermined rate that is greater than a given rate at which coded data is processed by a single decoder to produce the decoded data, comprising a data input bus;
a data output bus;
a ring of decoders, with each decoder being coupled to the input bus for receiving coded data from the input bus and coupled to the output bus for providing decoded data onto the output bus;
wherein each said decoder includes
an input buffer for responding to a start-input signal from a preceding decoder in the ring by buffering a block of the received coded data;
means for providing a start-input signal to a succeeding decoder in the ring at such time as to cause the succeeding decoder to receive a block of coded data from the input bus that overlaps the block of coded data received from the input bus by the instant said decoder;
processing means for processing the buffered block of coded data at a given rate to produce decoded data;
an output buffer for buffering the block of decoded data;
means for responding to a start-output signal provided by a preceding decoder in the ring by causing the buffered decoded data to be provided onto the data output bus at a predetermined rate that is greater than the given rate at which the coded data is processed to produce the decoded data; and
means for providing a start-output signal to the succeeding decoder in the ring to cause the succeeding decoder to provide a portion of the buffered decoded data therein onto the data output bus at a predetermined rate and at such time as to be continuous from and not overlap the portion of the buffered decoded data provided onto the output data bus from the instant said decoder.

13. A system according to claim 12, further comprising
a synchronization-state bus;
wherein each said decoder further comprises
means for synchronizing the coded data for processing by the processing means; and
means for providing onto the synchronization-state bus during the provision of the decoded data onto the output data bus, synchronization-state information indicating the synchronization state of the coded data for processing upon finishing the decoding of the block of coded data that is being provided onto the output data bus;
wherein the synchronizing means initialize the synchronization state of the coded data for processing by the processing means in accordance with the last synchronization-state information provided onto the synchronization-state bus prior to beginning to process a block of coded data.

14. A system according to claim 13,
wherein each said decoder further comprises
means responsive to a predetermined mode signal for causing the synchronizing means to initialize the synchronization state of the coded data for processing by the processing means prior to beginning to process a block of coded data, in accordance with the synchronization-state information provided on the synchronization-state bus by a predetermined master said decoder instead of in accordance with the last synchronization-state information provided on the synchronization-state bus by some other said decoder.

15. A system according to claim 13,
wherein each said decoder further includes
means for determining whether the coded data is in a synchronization state that enables the coded data to be correctly decoded by the processing means;
wherein the synchronizing means includes means for resynchronizing the coded data for processing by the processing means when it is determined that the coded data is not in a synchronization state that enables the coded data to be correctly decoded by the processing means; and
wherein the system further comprises
means for detecting a perturbation in the coded data received on the data input bus;
means for providing a sync-hold signal for a predetermined duration in response to detecting a said perturbation; and
means for responding to said sync-hold signal by inhibiting the synchronizing means from resynchronizing said coded data during the duration of said sync-hold signal.

16. A system according to claim 15, further comprising
means for inhibiting the synchronizing means from resynchronizing said coded data following the duration of the sync-hold signal until such time as a new block of coded data is buffered into the first buffering means of the first said decoder.

17. A system according to claim 12, further comprising
an activity-state bus;
wherein each said decoder includes
means for providing an activity indication signal on the activity-state bus while decoded data is being provided onto the data output bus from the instant said decoder; and
wherein at least one said decoder includes
means for monitoring the activity-state bus; and
means for ceasing operation of the instant said decoder if there is already an activity indication signal on the activity-state bus when the instant said decoder begins to provide decoded data onto the data output bus.

18. A system according to claim 17, further comprising
a system controller for monitoring the status of the activity-state bus and for providing a reset signal to the decoders when said monitoring does not detect that decoded data is being provided onto the output bus from the decoders in the ring;
wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

19. A system according to claim 12, wherein each said decoder further includes
means for ceasing operation of the instant said decoder if a start-input signal is received by the instant said decoder while the processing means thereof is processing said block of coded data.

20. A system according to claim 19, further comprising
an activity-state bus;
wherein each said decoder includes
means for providing an activity indication signal on the activity-state bus while decoded data is being provided onto the data output bus from the instant said decoder; and
wherein the system further comprises
a system controller for monitoring the status of the activity-state bus and for providing a reset signal to the decoders when said monitoring does not detect that decoded data is being provided onto the output bus from the decoders in the ring;
wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

21. A system according to claim 12, wherein each said decoder further includes
means for ceasing operation of the instant said decoder if a start-output signal is received by the instant said decoder while the processing means thereof is processing said block of coded data.

22. A system according to claim 21, further comprising
an activity-state bus;
wherein each said decoder includes
means for providing an activity indication signal on the activity-state bus while decoded data is being provided onto the data output bus from the instant said decoder; and
wherein the system further comprises
a system controller for monitoring the status of the activity-state bus and for providing a reset signal to the decoders when said monitoring does not detect that decoded data is being provided onto the output bus from the decoders in the ring;
wherein at least one of the decoders in the ring is responsive to said reset signal, in lieu of said start-input signal and in lieu of said start-output signal, for inputting a block of coded data into the input buffer and for causing buffered decoded data to be provided onto the data output bus respectively.

* * * * *